(12) United States Patent
Wang et al.

(10) Patent No.: US 11,030,382 B2
(45) Date of Patent: Jun. 8, 2021

(54) INTEGRATED CIRCUIT WITH CONSTRAINED METAL LINE ARRANGEMENT

(71) Applicants: TAIWAN SEMICONDUCTOR MANUFACTURING COMPANY LTD., Hsinchu (TW); TSMC CHINA COMPANY, LIMITED, Shanghai (CN)

(72) Inventors: XinYong Wang, Shanghai (CN); Li-Chun Tien, Tainan (TW); Yuan Ma, Shanghai (CN); Qiquan Wang, Shanghai (CN)

(73) Assignees: TAIWAN SEMICONDUCTOR MANUFACTURING COMPANY LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 16/670,000

(22) Filed: Oct. 31, 2019

(65) Prior Publication Data

US 2021/0110000 A1    Apr. 15, 2021

(30) Foreign Application Priority Data

Oct. 14, 2019    (CN) .......................... 201910974639.2

(51) Int. Cl.
    *G06F 30/394*      (2020.01)
    *G06F 30/398*      (2020.01)
    *H05K 1/02*      (2006.01)

(52) U.S. Cl.
    CPC .......... *G06F 30/398* (2020.01); *G06F 30/394* (2020.01); *H05K 1/0268* (2013.01)

(58) Field of Classification Search
    CPC .... G06F 30/398; G06F 30/394; H05K 1/0268
    See application file for complete search history.

(56) References Cited

U.S. PATENT DOCUMENTS

| | | | |
|---|---|---|---|
| 5,673,201 A * | 9/1997 | Malm | G06F 30/394 |
| | | | 716/129 |
| 7,222,322 B1 * | 5/2007 | Chyan | G06F 30/394 |
| | | | 716/122 |
| 7,260,442 B2 | 8/2007 | Hwang et al. | |
| 9,256,709 B2 | 2/2016 | Yu et al. | |
| 2006/0123373 A1 * | 6/2006 | Andreev | G06F 30/392 |
| | | | 716/122 |
| 2014/0040838 A1 | 2/2014 | Liu et al. | |

(Continued)

*Primary Examiner* — Nghia M Doan
(74) *Attorney, Agent, or Firm* — Hauptman Ham, LLP

(57) ABSTRACT

A method includes steps of dividing a first arrangement of metal lines in a circuit layout into two sets of metal lines, a first set of metal lines in a peripheral area, and a second set of metal lines in a center area. The arrangement of metal lines is configured to electrically connect to contacts of a second layer of the circuit layout. The method includes adjusting a metal line perimeter of at least one metal line in the center area to make a second arrangement of metal lines, where each adjusted metal line perimeter is separated from contacts in the second layer of the integrated circuit layout by at least a check distance. Metal line material is deposited into a set of openings in a dielectric layer of the integrated circuit, the set of openings corresponding to the second arrangement of metal lines.

20 Claims, 9 Drawing Sheets

(56) References Cited

U.S. PATENT DOCUMENTS

| | | | |
|---|---|---|---|
| 2014/0115546 A1* | 4/2014 | Wang | G06F 30/398 716/55 |
| 2014/0282289 A1* | 9/2014 | Hsu | G03F 1/70 716/51 |
| 2015/0278429 A1 | 10/2015 | Chang | |

* cited by examiner

INTEGRATED CIRCUIT WITH CONSTRAINED METAL LINE ARRANGEMENT

PRIORITY CLAIM

The present application claims the priority of CN Application No. 201910974639.2, filed Oct. 14, 2019, which is incorporated herein by reference in its entirety.

BACKGROUND

Modifications to an arrangement of metal lines in an integrated circuit layout during a circuit design process involve modifying a patterning template used to transfer a pattern associated with the arrangement of metal lines to an integrated circuit during a manufacturing process. Patterning template modifications are expensive operations in integrated circuit manufacturing, and the patterning templates are sufficiently complex that the pattern in the patterning template is modeled prior to making the template. Reducing patterning template complexity reduces the cost and time associated with making patterning templates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
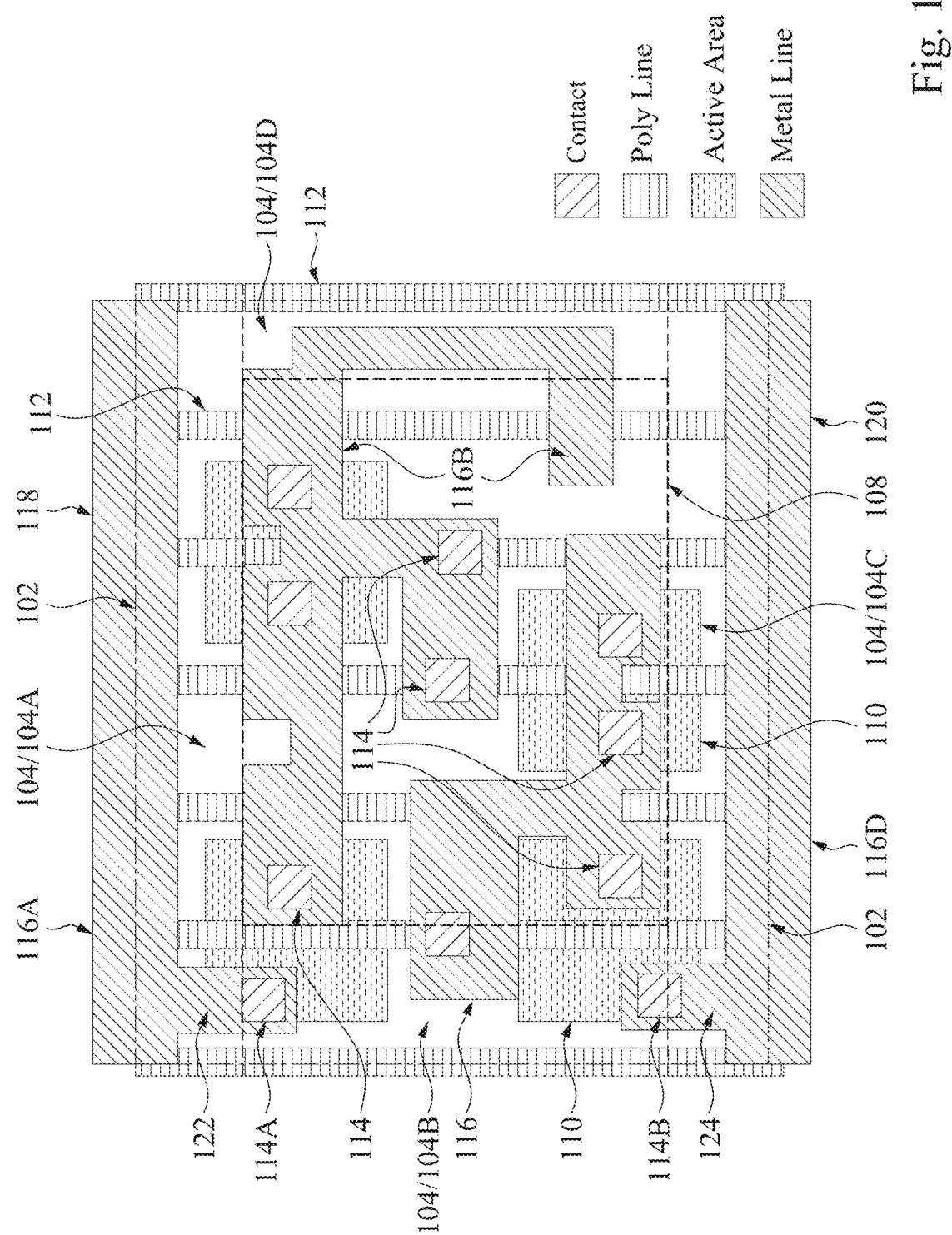
FIG. 1 is a top view of an area of an integrated circuit layout, according to some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the process of making integrated circuits, an arrangement of elements of the circuit in different layers is generated. The arrangement of elements includes conductive contacts, conductive lines, active areas, gate electrode lines, and so forth. Positions of contacts in layers of an integrated circuit are related to positions of elements such as conductive lines or active areas (e.g., source/drain areas of a transistor) in layers below the contacts. In some embodiments, conductive lines are metal lines embedded in a layer of dielectric material of the integrated circuit.

Positions of conductive lines in an integrated circuit are related to the position of contacts in layers below the metal line layer in order to form multi-layered interconnection structures within the integrated circuit. Metal line placement also includes consideration of a path of a metal line (e.g., metal line routing) through a layer of an integrated circuit to avoid interference with other elements of the circuit, and to reduce mask complexity to fabricate the arrangement of metal lines. A shape, or perimeter, of a metal line is related not only to position of contacts in layers below the metal line layer, but is also related to photolithography-related constraints on line shapes or line perimeters. Some metal line shapes are determined based on design rules for integrated circuit to reduce capacitive interference between metal lines in a single layer of the integrated circuit. Some metal line shapes are determined based on design rules to enhance separation between metal lines on one layer of an integrated circuit and contacts a lower layer of the integrated circuit to reduce capacitive interference between the metal lines and contacts in different layers.

During an integrated circuit design process, adjustments to position of elements in one layer of the integrated circuit impact the position of elements on different, or adjoining, layers of the integrated circuit. For example, adjustment of via positions in a first layer of an integrated circuit sometimes drives a modification of metal line positions in an upper layer of the integrated circuit where metal lines are intended to make electrical connections with the contacts with adjusted positions. Conversely, adjustments to positions and shapes of metal lines in an arrangement of metal lines in an integrated circuit layout sometimes drives changes in the positions of contacts in different layers of the integrated circuit layout.

Some embodiments of the present disclosure relate to a method of making an integrated circuit having areas of the integrated circuit where metal line arrangements remain constant or unchanged during a metal line adjustment process, sometimes called a tape-out process, where shapes or perimeters of metal lines are adjusted in order to reduce a complexity of a photolithography mask for patterning a layer of the integrated circuit or to reduce a likelihood of defects occurring during manufacturing of the integrated circuit.

FIG. 1 is a top view of a first area 100 of an integrated circuit layout, according to some embodiments. First area 100 has an area border 102 that surrounds the first area 100. First area 100 is divided into a peripheral area 104 and a center area 106. Peripheral area 104 includes four areas: a top peripheral area 104A and a bottom peripheral area 104C are on opposite sides of center area 106, and edge peripheral areas 104B and 104D are on opposite sides of center area 106 from each other. Cell boundary 108 separates center area 106 from peripheral area 104.

First area 100 includes active areas 110 and conductive lines 112 running over some active areas 110. Contacts 114 are positioned over some active areas 110 and some conductive lines 112. For example, some embodiments of a first area of an integrated circuit include lines of polysilicon as the conductive lines with metallic plugs as the contacts 114 to source/drain regions and gate electrodes of an integrated circuit. Metal lines 116A-116D are positioned over contacts 114 to convey signals to and from transistors or other circuit elements, and to regulate the operation of the transistors or other circuit elements.

In top peripheral area 104A, metal lines have a first top arrangement and include a $V_{DD}$ line 118 and an extension 122 in order to make an electrical connection with a contact 114A in edge peripheral area 104B. In bottom peripheral area 104C, metal lines have a first bottom arrangement and include a $V_{SS}$ line 120 with an extension 124 to make electrical connection with a contact 114B in edge peripheral area 104B. Edge peripheral area 104B has a first edge arrangement of metal lines, and edge peripheral area 104D has a second edge arrangement of metal lines.

Center area 106 has a first center arrangement of metal lines. During an integrated circuit design process, arrangements of metal lines in the peripheral areas 104A-104D are maintained while arrangements of metal lines in center area 106 are modified. By maintaining the arrangements of metal lines in peripheral areas 104A-104D during a layout process, changes in patterning templates or photolithography masks for a contact layer of the integrated circuit are reduced or eliminated. For example, VDD line 118 and VSS line 120 are elements of an integrated circuit that are suited to long runs. In some embodiments, VDD line 118 and VSS line 120 are straight metal line segments. By the use of extensions such as extension 122 or extension 124 to make electrical connections with contacts to a lower layer of an integrated circuit, the main portions of VDD lines 118 and of VSS lines 120 continue for long distances without changes in direction, simplifying the photolithography mask used to make metal lines in the integrated circuit. By constraining an area in which positions or perimeters of metal lines are adjusted, mask complexity is reduced and mask redesign operations are made less frequent and less complex. Reduced complexity assists with faster design of the integrated circuit; and increased profitability of a manufacturing process for the integrated circuit.

Figure 2:
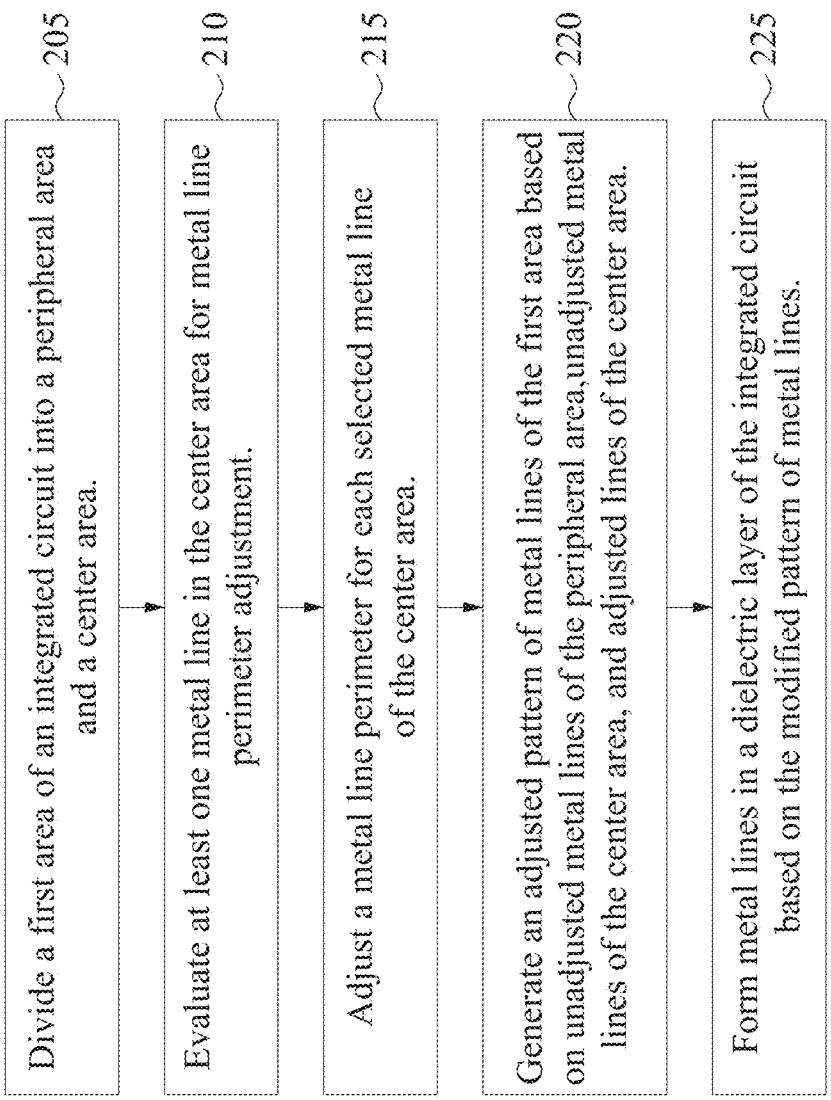
FIG. 2 is a flow diagram of a method of modifying an arrangement of metal lines for integrated circuit, according to some embodiments.

FIG. 2 is a flow diagram of a method 200 of modifying an arrangement of metal lines for an integrated circuit, according to some embodiments. Method 200 is used, in some embodiments, to make an integrated circuit as described below in FIG. 3, by holding routing patterns of metal lines in peripheral areas fixed, while providing flexibility in routing metal lines in the interior portions of the cells of the IC. In operation 205, an area of the integrated circuit is divided into a peripheral area and a center area. Examples of a peripheral and a center area are given below in the description of FIG. 3 (where 304A1-A5, 304B, 304C1-C5, and 304D make up a peripheral area 304, and element 306 is a center area). A peripheral area is an area associated with elements that are common to one or more cells of an integrated circuit. Some elements include power or ground lines that span a width of one or more cells in an integrated circuit, and are amenable to continuous runs across a span of two or more cells in order to reduce cell size and/or reduce mask complexity by providing uninterrupted lengths of metal lines acting as VDD or VSS lines in the circuit.

In an operation 210, at least one metal line of the metal lines in the center area is evaluated in order to determine whether metal line perimeter adjustment is to be performed on the metal line in the arrangement of metal lines. In some embodiments, metal lines 116B and 116C are metal lines that cross from a center area to a peripheral area. In some embodiments, metal lines 116A and 116D are metal lines that do not enter into a center area 106, but remain entirely in a peripheral area 104 of the first area 100 of the integrated circuit layout of FIG. 1. When a metal line crosses from a center area to a peripheral area, the portion of the metal line that crosses the cell boundary (see, e.g., cell boundary 108 in FIG. 1) is not adjusted when the portion of the metal line within the center area undergoes metal line perimeter adjustment. In some embodiments, the interference of a metal line with a nearest contact is avoided by reducing an amount of the metal line perimeter adjustment.

In operation 215, a metal line perimeter of each metal line of the set of metal lines in the center area of the first area undergoes metal line perimeter adjustment. In some embodiments, the adjustment of a metal line perimeter is described in FIGS. 4A-4C, where metal line 406 is divided into areas, and each area is evaluated independently to determine a final shape of the metal line perimeter. Metal line perimeter adjustment is performed in order to simplify a patterning template (e.g., a photolithography mask for forming features on a semiconductor substrate), or to improve likelihood of successful manufacturing of a metal line pattern in a manufacturing process for the integrated circuit.

In operation 220, an adjusted pattern of metal lines is generated according to the adjustments of individual metal line perimeters for each metal line in the center area of the first area of the integrated circuit. In some embodiments, the adjusted pattern of metal lines is generated using an electronic design automation (EDA) system as described hereinbelow in FIG. 6. In some embodiments of method 200, the adjustment to a metal line perimeter includes joining two metal lines to each other. Joining of two metal lines is performed when two adjacent metal lines have a same function in the integrated circuit and when the joined line operates in a manner similar to the operation of the two independent separate lines. By joining lines, a patterning template is simplified as compared to a state of the patterning template without the joined metal lines. In some embodiments of method 200, metal line perimeter adjustment includes smoothing a perimeter of the metal line. Perimeter smoothing includes enlarging some portions of a metal line in order to have continuous substantially linear edges of the metal line along the adjusted and unadjusted adjoining edges of the metal line sidewall. The creation of smoother metal line edges or sidewalls simplifies the mask used to generate the metal lines in an integrated circuit, thereby reducing the cost to make the circuit and the likelihood of manufacturing errors. In some instances, the metal line perimeter adjustment includes extending or enlarging a portion of a metal line closer to another metal line in the same layer of the integrated circuit. Metal lines in the adjusted pattern of metal lines include metal lines in the first area that do not undergo any perimeter adjustment, metal lines that undergo a partial perimeter adjustment, metal lines that undergo a complete perimeter adjustment, and metal lines that are joined together. The adjusted pattern of metal lines further includes metal lines in the peripheral area of the first area, which did not undergo any metal line perimeter adjustment, but retain their initial pattern, perimeters, or routing in the layer of the integrated circuit. In an operation 225, the metal lines are formed in a manufacturing process as described hereinabove in wafer fabrication 752 of system 700, below.

Figure 3:
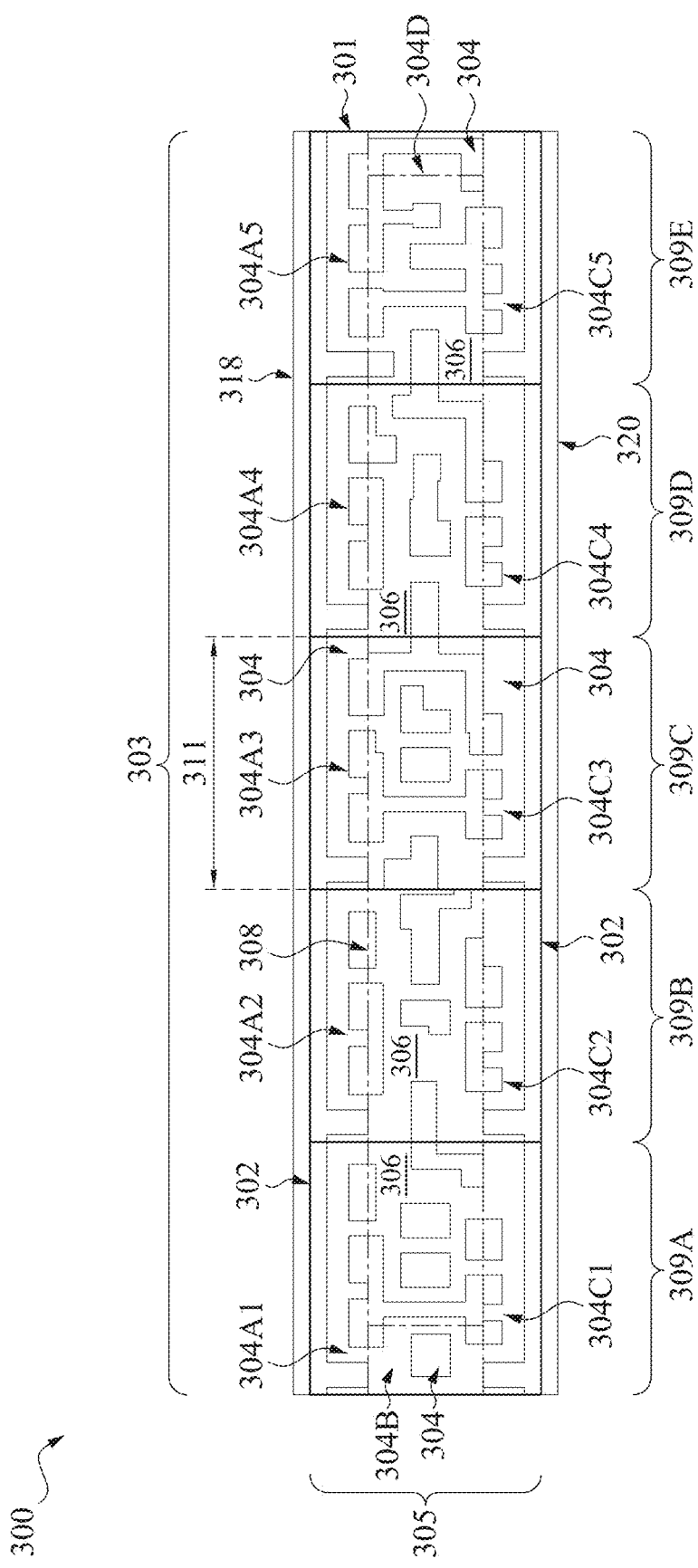
FIG. 3 is a top view of an area of an integrated circuit layout, according to some embodiments.
Figure 4A:
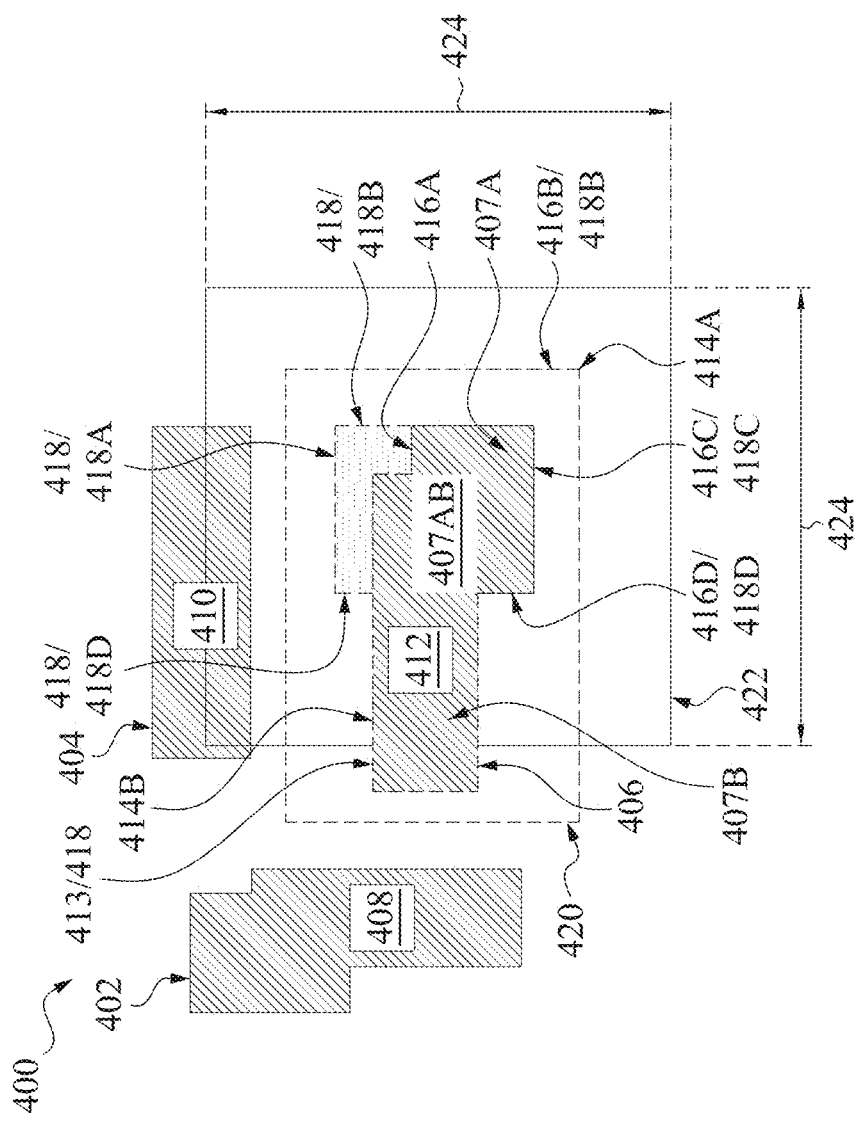
FIGS. 4A-4C are top views of an integrated circuit layout during a metal line perimeter adjustment process, according to some embodiments.
Figure 4B:
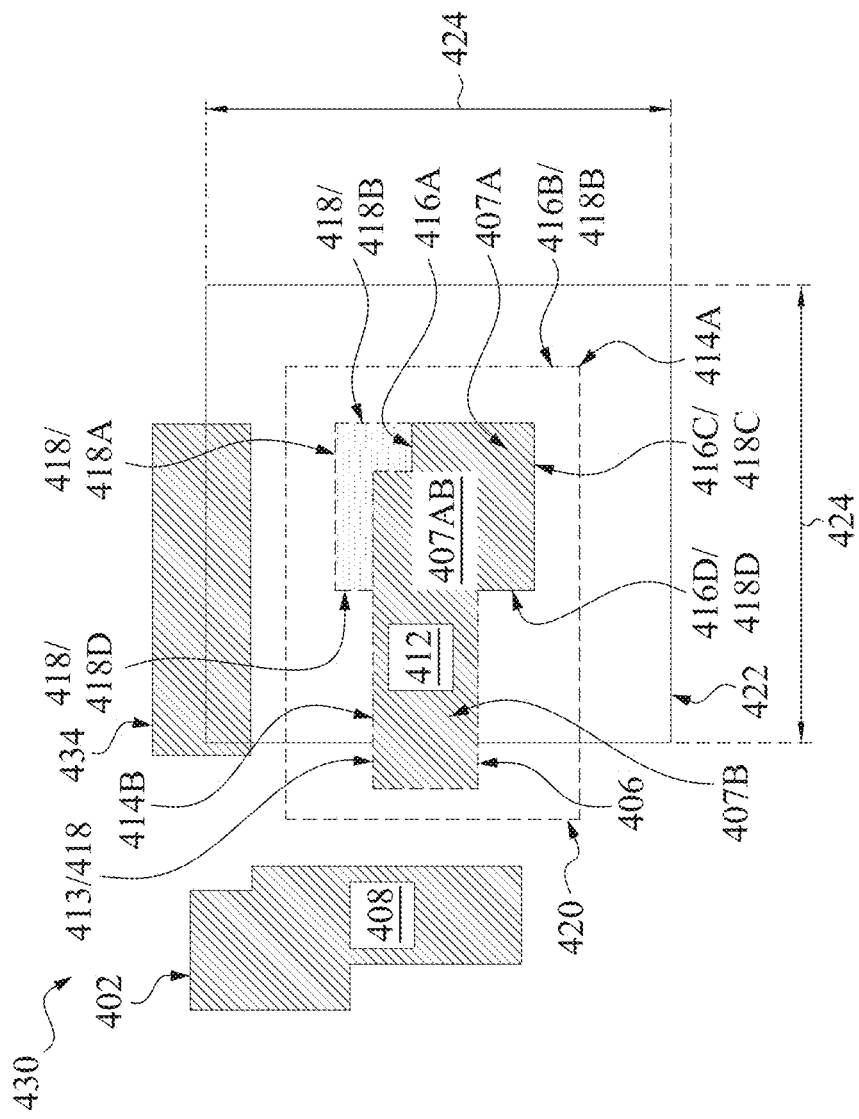
Figure 4C:
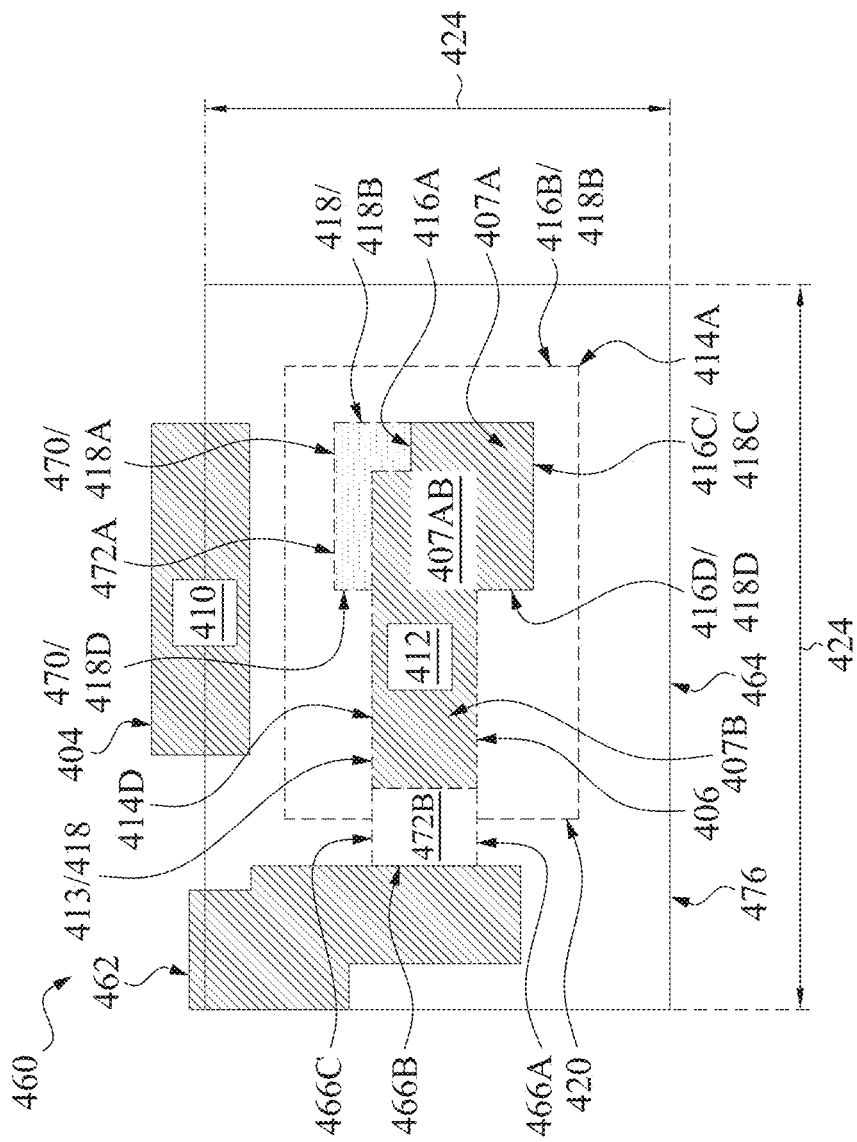

FIG. 3 is a top view of an integrated circuit layout 300 having a first area 301, according to some embodiments. IC layout 300 is one embodiment that reflects changes made to an integrated circuit layout using method 200, as described above. FIGS. 4A-4C, described below, describe further details of how method 200 is implemented in some embodiments to make an IC layout such as IC layout 300 described hereinbelow. First area 301 has an area boundary 302, an area length 303, and an area width 305, where area length 303 is greater than area width 305. First area 301 has a center area 306 and a peripheral area 304 comprising edge peripheral area 304B and edge peripheral area 304D, top peripheral areas 304A1-304A5, and bottom peripheral areas 304C1-304C5. Peripheral area 304 is separated from center area 306 by intra-cell boundary 308. First area 301 is divided into regions 309A-309E such that all regions have the area width 305, and each region has a region length 311 equal to the area length 303 divided by the number of regions. In FIG. 3, region length 311 is ⅕ of area length 303 because there are five regions 309A-309E. The metal line pattern in first area 301 includes each top peripheral area 304A1-304A5 having a same top peripheral area metal line pattern, and each bottom peripheral area 304C1-304C5 having a same bottom peripheral metal line pattern.

In FIG. 3, area 309A and area 309E are terminal areas of the first area 301, and areas 309B-309D are non-terminal areas of the first area. Terminal areas 309A and 309E are areas in which portions of the peripheral area 304 surround center area 306 on three sides. In terminal area 309A, edge peripheral area 304B is adjoined by top peripheral area 304A1 and bottom peripheral area 304C1. In terminal 309E, edge peripheral area 304D is adjoined by top peripheral area 304A5 and bottom peripheral area 304C5. Non-terminal areas 309B, 309C, and 309D are areas in which portions of the peripheral area are on two non-adjacent sides of center area 306.

In some embodiments, metal lines in the center area 306 are evaluated for metal line perimeter adjustment according to operation 210 of method 200. According to some embodiments, metal lines in peripheral area 304, including peripheral areas 304A1-A5, 304B, 304C1-C5, and 304D are not evaluated for metal line perimeter adjustment according to operation 210.

VDD line 318 extends through each of top peripheral areas 304A1-304A5, and VSS line 320 extends through each of bottom peripheral areas 304C1-304C5. The pattern of VDD line 318 is the same in each of regions 309A-309E, and the pattern of the VSS line 320 is the same in each of regions 309A-309E. VDD lines and VSS lines are examples of metal lines in a peripheral area 304 that are not evaluated for metal line perimeter adjustment under operation 210 of method 200 because metal lines that conduct voltage to or from cells of the integrated circuit extend over long regions of the integrated circuit layout. By preserving the VDD and VSS lines in a straight pattern, or by preventing line position adjustment, the metal line patterns inside the center area are simplified and have less complex routing patterns than when both the center-area metal lines and the perimeter area metal lines are subject to metal line perimeter adjustment. Thus, each region of first area 301 represents a portion of the region in which the metal line pattern in a top or bottom peripheral area repeats in order to simplify mask layout and reduce complexity of mask generation for masks and pattern transfer devices in integrated circuit manufacturing.

FIG. 4A is a top view of an integrated circuit layout 400 during a metal line perimeter adjustment process, according to some embodiments. In FIG. 4A, the adjustment of one portion of a metal line is evaluated using a check window to determine whether the adjusted metal line approaches too closely to a contact connected to another metal line in the integrated circuit, as is described in Method 200 operation 210, above. As described further, below, metal line 406 does not proceed to operations 215 or 220 in method 200 because the metal line 406 approaches too closely to contact 410 upon metal line perimeter adjustment.

Integrated circuit layout 400 includes three metal lines 402, 404, and 406 in a first layer of the integrated circuit layout, and where metal line 402 is configured to connect with contact 408, metal line 404 is configured to connect with contact 410, and metal line 406 is configured to connect to contact 412. In FIG. 4A, metal line 406 is evaluated for metal line perimeter adjustment.

Metal line perimeter adjustment is performed to make metal lines in an integrated circuit more resilient to defects of the manufacturing process for making the circuit, and/or to reduce the complexity or cost of the patterning templates (e.g., the photolithography masks) used to manufacture the metal lines in the circuit. During a metal line perimeter adjustment process similar to operation 210 of method 200 above, portions of an initial metal line perimeter are evaluated individually to determine whether an adjustment of the metal line perimeter is to be made.

In integrated circuit layout 400, metal line 406 has an initial perimeter 413. Portions of the initial perimeter 413 to be considered for metal line adjustment are determined by analyzing the shape of the metal line 406. Portions of initial perimeter 413 to be adjusted are, in some embodiments, found by modeling the shape of the initial perimeter 413 using overlapping rectilinear shapes. The initial perimeter 413 of metal line 406 is successfully modeled by combining two rectangular shapes comprising the first line area 407A, the second line area 407B, and a third line area (an overlapping line area) 407AB. The first rectilinear shape includes first line area 407A and third line area 407AB, and the second rectilinear area includes second line area 407B and third line area 407AB. In some embodiments, the initial perimeter is modeled with shapes other than rectilinear shapes. In some embodiments, modeling shapes include trapezoids, parallelograms, ellipses, circles, triangles, and so forth.

Metal line adjustment occurs by evaluating the effect of moving one edge of a metal line (or, a side of a rectilinear area used to model the initial metal line perimeter) at a time, as described below. During metal line adjustment, the edges (or, perimeter segments) of a first rectilinear area used to model the initial metal line perimeter are evaluated for adjustment while holding the dimensions of each other rectilinear area used to model the initial metal line perimeter unchanged. Edges of a metal line are adjusted using an electronic design automation (EDA) system, as described below with regard to FIG. 6. In some embodiments, metal line adjustment includes a combination of both EDA system adjustment and human-directed adjustment, or regulation of the EDA system.

In FIG. 4A, first perimeter portion 414A of the initial perimeter 413 and is represented by a solid line. Second perimeter portion 414B of the initial perimeter 413 and is represented by a line with long dashes. First perimeter portion 414A and second perimeter portion 414B are evaluated for metal line position adjustment independently. In a first round of metal line perimeter adjustment, first perimeter portion 414A is a modifiable portion and second perimeter portion 414B is a fixed portion. In a second round of metal line perimeter adjustment, first perimeter portion is a fixed portion and second perimeter portion 414B is a modifiable portion. For purposes of clarity, adjustment of first perimeter portion 414A is described hereinbelow. Other perimeter portion adjustments are performed with similar steps.

During a perimeter adjustment process, each edge of first perimeter portion 414A is adjusted as follows: first perimeter segment 416A is shifted toward metal line 404 to a position indicated by adjusted perimeter segment 418A. Second perimeter segment 416B is not adjusted, as indicated by adjusted perimeter segment 418B. Third perimeter segment 416C is not adjusted, as indicated by adjusted perimeter segment 418C. Fourth perimeter segment 416D is extended, on an opposite of metal line 406, toward metal line 404, as shown by adjusted perimeter segment 418D. A perimeter segment that is not moved is called "adjusted" when the segment forms part of the adjusted perimeter 418, despite there being no adjustment to the segment. Adjusted perimeter 418 includes second perimeter portion 414B and adjusted perimeter segments 418A-D. According to some embodiments, a perimeter segment is moved away from a center of the rectilinear area that describes part of the initial perimeter of the metal line, and toward an adjacent metal line. According to some embodiments, a perimeter segment is moved toward a center of the rectilinear area that describes part of the initial perimeter of the metal line, and away from an adjacent metal line.

A check window 422 surrounds the adjusted perimeter 418 at a check distance 424 from the adjusted perimeter 418. The check window 422 is configured to determine whether or not the unmodified second perimeter portion 414B of the initial perimeter 413 violates a design rule of the integrated circuit. Design rules of an integrated circuit describe, inter alia, structural features of the integrated circuit that satisfy performance specifications of the integrated circuit. Structural features of the integrated circuit include spacing distances between conductive elements of the circuit that hold, for example, capacitance between the conductive elements below a threshold that allows the circuit to meet performance specifications. Spacing distances between conductive elements include spacing distances between adjacent metal lines, spacing distances between metal lines and vias, and so forth. Check window 422 is positioned at a check distance 424 away from perimeter segments 418A-D to aid in determining whether the perimeter segments 418A-D violate a design rule of the integrated circuit. In FIG. 4A, metal line 406, after a metal line perimeter adjustment process, does not violate a design rule of the integrated circuit with regard to metal line 402 or contact 408. However, metal line 406 does violate a design rule of the integrated circuit with regard to metal line 404 and contact 410, because contact 410 falls within check window 422, based on the position of the perimeter segment 418A. An initial check window 420 around initial perimeter 413 shows that the initial metal line perimeter does not overlap with any contacts connected to metal lines adjoining the metal line 406. Check window 422 is different from initial check window 420, because the check window 422 evaluates the effect of the changed perimeter, not the entire perimeter, during metal line perimeter adjustment.

FIG. 4B is a top view of an integrated circuit layout 430 during a metal line perimeter adjustment process, in accordance with some embodiments. In FIG. 4B, the adjustment of one portion of a metal line is evaluated using a check window to determine whether the adjusted metal line approaches too closely to a contact connected to another metal line in the integrated circuit, as is described in Method 200 operation 210, above. As described further below, in FIG. 4B, the metal line 406 undergoing perimeter adjustment does not approach too closely to a contact connected to another metal line (e.g., there is no contact to metal line 434), so the metal line 406 proceeds to operations 215 and 220 in method 200.

The integrated circuit layout of FIG. 4B is identical to the integrated circuit layout of FIG. 4A, with the exception of contact 410, which is absent from FIG. 4B. Thus, elements of FIG. 4B that correspond to a description provided above in FIG. 4A have a same identifying numeral. In integrated circuit layout 430, In FIG. 4B, metal line 434 does not make a connection with a contact in a lower layer of the integrated circuit. Thus, after metal line perimeter adjustment to generate adjusted perimeter 418, there is no contact within check window 422 and no violation of a design rule for the integrated circuit, as is the case in FIG. 4A because of the presence of contact 410 in integrated circuit layout 400.

FIG. 4C is a top view of an integrated circuit layout 460 during a metal line perimeter adjustment process, in accordance with some embodiments. In FIG. 4C, the adjustment of one portion of a metal line is evaluated using a check window to determine whether the adjusted metal line approaches too closely to a contact connected to another metal line in the integrated circuit, as is described in Method 200 operation 210, above. As described further below, in FIG. 4C, the metal line 406 undergoing perimeter adjustment does not approach too closely to a contact connected to one metal line (e.g., there is no contact to metal line 462), but does approach too closely to a contact connected to another metal line (e.g., there is a contact 410 connected to metal line 404) so only one of two possible metal line perimeter adjustments is made as the metal line 406 proceeds to operations 215 and 220 in method 200.

The integrated circuit layout of FIG. 4C is identical to the integrated circuit layout of FIG. 4A, with the exception of contact 408, which is absent from FIG. 4C. Thus, elements of FIG. 4C that correspond to a description provided above in FIG. 4A have a same identifying numeral. In FIG. 4C, metal line 462 does not electrically connect with a contact in a lower layer of the integrated circuit. In integrated circuit layout 460, metal line 406 undergoes a metal line perimeter adjustment process similar to the process for integrated circuit layout 400 in FIG. 4A.

While perimeter adjustment of metal line area 407A results in a design rule violation because the check window 476 around adjusted metal line area 472A coincides with contact 410, as described in FIG. 4A, above, perimeter adjustment of metal line area 407B does not result in a design rule violation because the check window 476 around adjusted metal line area 472B does not coincide with a contact connected to metal line 462. Adjusted metal line area 472B includes metal line segments 466A-466C that extend beyond second perimeter portion 414B toward metal line 462.

When an adjusted perimeter of a metal line approaches too closely to an adjoining feature in the same layer of the integrated circuit, or in a lower layer of the integrated circuit, the metal line with the adjusted perimeter violates a design rule of the integrated circuit, as described above in FIG. 4A and FIG. 4C, where adjusted metal line perimeter 418 interferes with contact 410. One non-limiting example of a design rule violation occurs when adjusting a layout of an integrated circuit results in the adjusted metal line and an adjoining metal line having an increase in parasitic capacitance, resulting in slower switching frequency and/or increased power consumption of the integrated circuit, as may occur when an integrated circuit layout violates a design rule with a contact (see contact 410) within a check window 422 around an adjusted line perimeter 418 in FIG. 4A.

Figure 5:
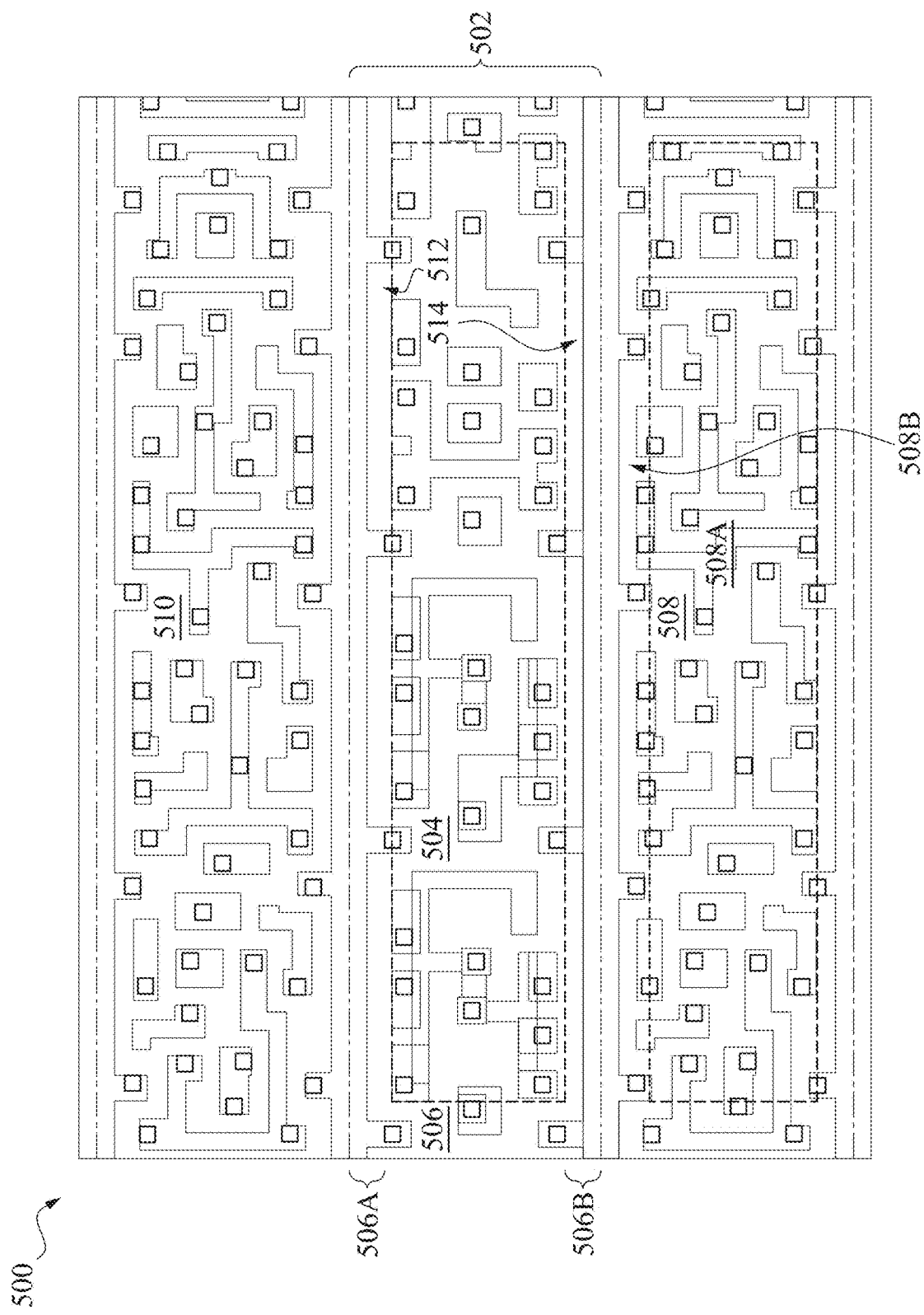
FIG. 5 is a top view of an integrated circuit layout, according to some embodiments.

FIG. 5 is a top view of an integrated circuit layout 500 having areas with different arrangements of metal lines. Integrated circuit layout 500 resembles integrated circuit 300 in FIG. 3, above, but includes additional information about neighboring areas to clarify how the power delivery rail (conductive line 512) is shared across the peripheral area of two separate areas of the integrated circuit layout 500 that qualify for central-area metal line perimeter adjustment. Integrated circuit layout 500 has a first area 502 with a center area 504 and a peripheral area 506. Peripheral area 506 has a top peripheral area 506A, and a bottom peripheral area 506B. Top peripheral area 506A adjoins first circuit area 510, and bottom peripheral area 506B adjoins second circuit area 508. Conductive line 512 extends across the top peripheral area 506A in first area 502. Conductive line 514 extends across the bottom peripheral area 506B. Conductive lines 512 and 514 are shared lines across a border of first area 502. Thus, conductive line 512 is shared by first area 502 and first circuit area 510, and conductive line 514 is shared by first area 502 and second circuit area 508. Peripheral area 506 is an area in which metal line routing is held constant during a circuit layout design process. Metal lines in center area 504 undergo perimeter adjustment and/or routing adjustment in order to simplify mask manufacturing and improve inverted circuit performance. In some embodiments, one or more areas of an integrated circuit with a fixed perimeter area and a modifiable center area adjoin each other. Thus, in some embodiments second circuit area 508 includes a second center area 508A and a second peripheral area 508B as described hereinabove regarding first area 502.

Figure 6:
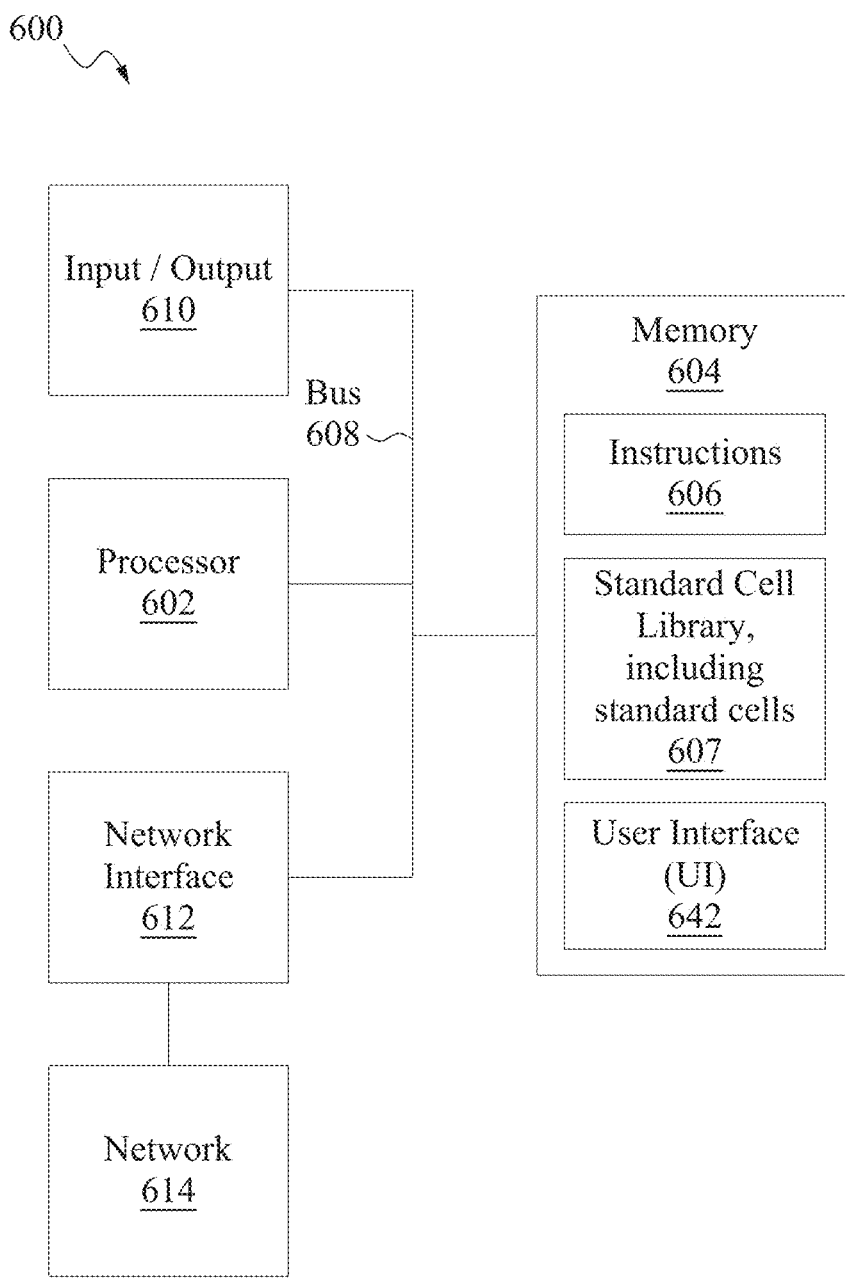
FIG. 6 is a block diagram of an electronic design automation (EDA) system, in accordance with some embodiments.

FIG. 6 is a block diagram of an EDA system 600 in accordance with some embodiments. EDA system 600 is used in the preparation of IC layouts such as IC layout 300 and IC layout 500, provided above, and feeds information to a manufacturing process flow as described in FIG. 7, below. Electronic design automation is used to describe positions of contacts and other circuit elements in order to satisfy design rules of an integrated circuit, to meet circuit performance standards, and to reduce the overall area on a semiconductor wafer to generate the integrated circuit. In some embodiments, EDA system 600 is used to calculate check windows such as check windows 420 and 422, and check distance 424, when evaluating integrated circuit layouts.

In some embodiments, EDA system 600 includes an automatic pattern generating system. Methods described herein of designing layout diagrams for arrangements of metal lines or metal line routing arrangements, in accordance with one or more embodiments, are implementable, for example, using EDA system 600, in accordance with some embodiments.

In some embodiments, EDA system 600 is a general purpose computing device including a hardware processor 602 and a non-transitory, computer-readable storage medium 604. Storage medium 604, amongst other things, is encoded with, i.e., stores, computer program code 606, i.e., a set of executable instructions. Execution of instructions 606 by hardware processor 602 represents (at least in part) an EDA tool which implements a portion or all of, e.g., the methods described herein in accordance with one or more (hereinafter, the noted processes and/or methods).

Hardware processor 602 is electrically coupled to computer-readable storage medium 604 via a bus 608. Hardware processor 602 is also electrically coupled to an I/O interface 610 by bus 608. A network interface 612 is also electrically connected to hardware processor 602 via bus 608. Network interface 612 is connected to a network 614, so that hardware processor 602 and computer-readable storage medium 604 are capable of connecting to external elements via network 614. Hardware processor 602 is configured to execute computer program code 606 encoded in computer-readable storage medium 604 in order to cause EDA system 600 to be usable for performing a portion or all of the noted processes and/or methods. In one or more embodiments, hardware processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, storage medium 604 stores computer program code 606 configured to cause EDA system 600 (where such execution represents (at least in part) the EDA tool) to be usable for performing a portion or all of the noted processes and/or methods. In one or more embodiments, storage medium 604 also stores information which facilitates performing a portion or all of the noted processes and/or methods. In one or more embodiments, storage medium 604 stores library 607 of standard cells including such standard cells as disclosed herein.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 also includes network interface 612 coupled to processor 602. Network interface 612 allows EDA system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 600.

EDA system 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a UI through I/O interface 610. The information is stored in computer-readable medium 604 as user interface (UI) 642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 7:
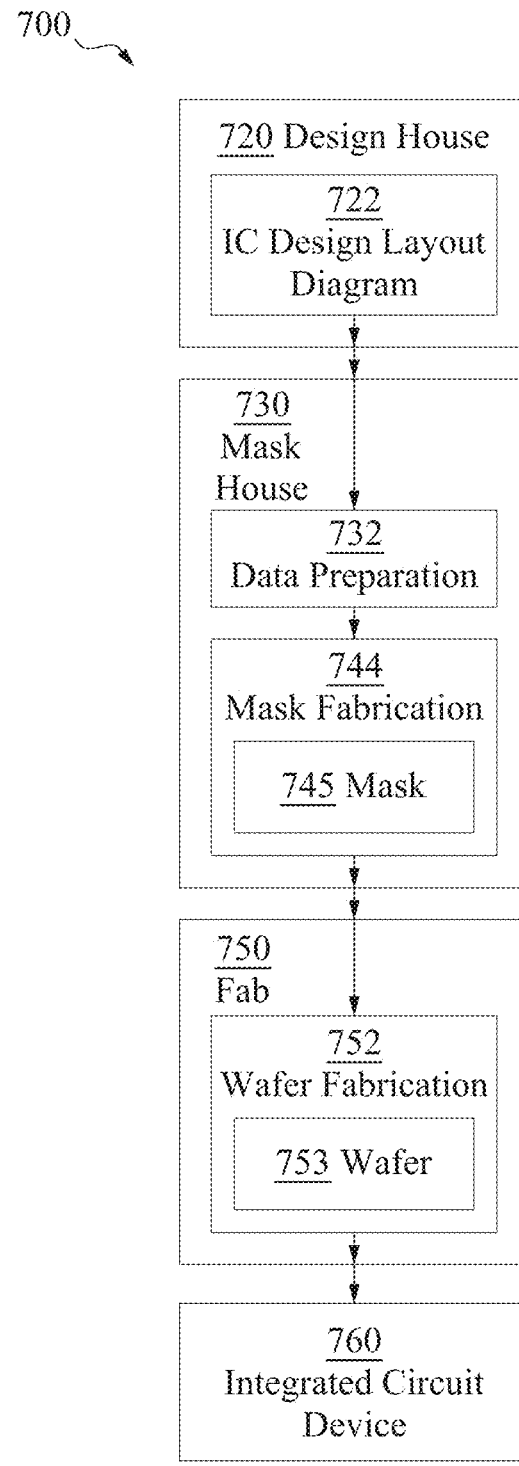
FIG. 7 is a block diagram of an integrated circuit manufacturing system, and an IC manufacturing flow associated therewith, in accordance with some embodiments.

FIG. 7 is a block diagram of an integrated circuit (IC) manufacturing system 700, and an IC manufacturing flow associated therewith, in accordance with some embodiments. IC manufacturing system 700 receives information from an EDA system 600, as described above, in order to perform processing steps on substrates to form integrated circuits according to a the EDA system 600 output and meeting design specifications configured to achieve a predetermined circuit performance result. In some embodiments, based on a layout diagram, at least one of (A) one or more semiconductor masks or (B) at least one component in a layer of a semiconductor integrated circuit is fabricated using manufacturing system 700. In accordance with some embodiments, integrated circuit manufacturing system 700 performs the steps associated with operation 225 of method 200 to deposit materials and etch shapes associated with an integrated circuit on a substrate.

In FIG. 7, IC manufacturing system 700 includes entities, such as a design house 720, a mask house 730, and an IC manufacturer/fabricator ("fab") 750, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and IC fab 750 is owned by a single larger company. In some embodiments, two or more of design house 720, mask house 730, and IC fab 750 coexist in a common facility and use common resources.

Design house (or design team) 720 generates an IC design layout diagram 722. In some embodiments, a design house 720 performs operations of method 200 associated with evaluating a pattern of metal lines, and adjusting the pattern of metal lines, prior to an IC fab 750 using the integrated circuit layouts generated by the design house to form the IC at the IC fab 750. IC design layout diagram 722 includes various geometrical arrangements designed for an IC device 760. The geometrical arrangements correspond to arrangements of metal, oxide, or semiconductor material segments that make up the various components of IC device 760 to be fabricated. The various layers combine to form various IC features. For example, a portion of IC design layout diagram 722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 720 implements a proper design procedure to form IC design layout diagram 722. The design procedure includes one or more of logic design, physical design or place and route. IC design layout diagram 722 is presented in one or more data files having information of the geometrical arrangements. For example, IC design layout diagram 722 can be expressed in a GDSII file format or DFII file format.

Mask house 730 includes data preparation 732 and mask fabrication 744. Mask house 730 uses IC design layout diagram 722 to manufacture one or more masks 745 to be used for fabricating the various layers of IC device 760 according to IC design layout diagram 722. Mask house 730 performs mask data preparation 732, where IC design layout diagram 722 is translated into a representative data file ("RDF"). Mask data preparation 732 provides the RDF to mask fabrication 744. Mask fabrication 744 includes a mask writer. A mask writer converts the RDF to an image on a substrate, such as a mask (reticle) 745 or a semiconductor wafer 753. The IC design layout diagram 722 is manipulated by mask data preparation 732 to comply with particular characteristics of the mask writer and/or requirements of IC fab 750. In FIG. 7, mask data preparation 732 and mask fabrication 744 are illustrated as separate elements. In some embodiments, mask data preparation 732 and mask fabrication 744 can be collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts IC design layout diagram 722. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 732 includes a mask rule checker (MRC) that checks the IC design layout diagram 722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 722 to compensate for limitations during mask fabrication 744, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout diagram 722 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 722.

It should be understood that the above description of mask data preparation 732 has been simplified for the purposes of clarity. In some embodiments, data preparation 732 includes additional features such as a logic operation (LOP) to modify the IC design layout diagram 722 according to manufacturing rules. Additionally, the processes applied to IC design layout diagram 722 during data preparation 732 may be executed in a variety of different orders.

After mask data preparation 732 and during mask fabrication 744, one or more masks 745 (or, photomasks, or reticles) are fabricated based on the modified IC design layout diagram 722. In some embodiments, mask fabrication 744 includes performing one or more lithographic exposures based on IC design layout diagram 722. In some embodiments, an electron-beam (e-beam) or a mechanism of multiple e-beams is used to form a pattern on the one or more masks 745 based on the modified IC design layout diagram 722. Masks 745 can be formed in various technologies. In some embodiments, masks 745 are formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 745 includes a transparent substrate (e.g., fused quartz) and an opaque material (e.g., chromium) coated in the opaque regions of the binary mask. In another example, mask 745 is formed using a phase shift technology. In a phase shift mask (PSM) version of mask 745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 744 is used in a variety of processes. For example, such a mask(s) is used in an ion implantation process to form various doped regions in semiconductor wafer 753, in an etching process to form various etching regions in semiconductor wafer 753, and/or in other suitable processes.

IC fab 750 includes wafer fabrication 752. IC fab 750 is an IC fabrication business that includes one or more manufacturing facilities for the fabrication of a variety of different IC products. In some embodiments, IC fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

In some embodiments, wafer fabrication 752 includes operations associated with depositing layers of dielectric materials on a semiconductor wafer, or layers materials already on a semiconductor wafer, in order to insulate metal lines in an integrated circuit from each other. Dielectric materials deposited on a semiconductor wafer include, in some embodiments, silicon dioxide, spin on glass, fluorinated silica glass (FSG), boron-phosphorus silica glass (BPSG), or other dielectric materials commonly used in integrated circuit manufacturing, including low-K dielectric materials. Dielectric materials are deposited using chemical vapor deposition, deposition of liquid materials followed by film thinning (by rotation of a wafer to remove excess deposition liquid), or atomic layer deposition (ALD) to build up layers of dielectric materials, into which contact openings were trench openings are formed by etching processes.

Contacts are formed in layers of an integrated circuit by depositing layers of patterning material, such as photoresist, and using photolithography or other pattern transfer techniques to generate a pattern in the patterning material such that, after removal of material within a portion of the pattern formed in the layer of patterning material, and exposed portion of an underlying dielectric material is removed and conductive material is deposited in the opening to make electrical connections with a conductive feature below the etched dielectric material.

In some embodiments, contacts are formed by plasma etching dielectric materials through openings in a photoresist layer to form contact openings through the dielectric material to expose, for example, a source/drain region or a gate electrode surface. Once contact openings have been formed through the layer of dielectric material, liner materials, anti-diffusion barriers, or seed layers are deposited onto sidewalls of the opening in the dielectric material, followed by deposition of conductive material in the contact opening. In some embodiments, conductive material deposited in a contact opening includes metals such as tungsten, nickel, titanium, platinum, cobalt, and alloys thereof, as well as other formulations for conductive contact materials known to practitioners of the art.

Metal lines are formed in a layer of dielectric material by depositing a layer of patterning material, such as photoresist, and using photolithography or other pattern transfer techniques to generate a pattern in the patterning material such that, after removal of material within a portion of the pattern formed in a layer patterning material, the exposed portion of underlying dielectric serial is removed, and conductive material is deposited in the line opening or trench opening.

In some embodiments, conductive material deposited into line openings or trench openings include metals such as tungsten, nickel, platinum, titanium, cobalt, and alloys thereof, as well as other formulations for metal lines known to practitioners of the art.

IC fab 750 uses mask(s) 745 fabricated by mask house 730 to fabricate IC device 760. Thus, IC fab 750 at least indirectly uses IC design layout diagram 722 to fabricate IC device 760. In some embodiments, semiconductor wafer 753 is fabricated by IC fab 750 using mask(s) 745 to form IC device 760. In some embodiments, the IC fabrication includes performing one or more lithographic exposures based at least indirectly on IC design layout diagram 722. Semiconductor wafer 753 includes a silicon substrate or other proper substrate having material layers formed thereon. Semiconductor wafer 753 further includes one or more of various doped regions, dielectric features, multi-level interconnects, and the like (formed at subsequent manufacturing steps).

Details regarding an integrated circuit (IC) manufacturing system (e.g., system 700 of FIG. 7), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

As disclosed herein, integrated circuits include complex arrangements of metal lines to make electrical connections with contacts on lower layers of the integrated circuit. During a design process for the integrated circuit, adjustments in an arrangement of metal lines sometimes drives changes to a positions of contacts in a lower layer of the integrated circuit, resulting in additional cost associated with redesigning a patterning element or photolithography mask associated with the positions of contacts in the lower layer of the integrated circuit. One technique for eliminating or reducing the additional costs associated with redesigning a patterning element or photolithography mask associated with positions of contacts in lower layers of the integrated circuit involves holding a peripheral portion of an integrated circuit area unchanged during a metal line adjustment process, while a central portion of the integrated circuit area is allowed to undergo metal line perimeter adjustment, also called metal line routing adjustment.

Some aspects of the present disclosure relate to method of making an integrated circuit that includes dividing, in a first layer of an integrated circuit layout, a first arrangement of metal lines into a first set of metal lines and a second set of metal lines, wherein the first set of metal lines is located in a peripheral area of the integrated circuit layout and the second set of metal lines is located in a center area of the integrated circuit layout, wherein the first arrangement of metal lines is located in the first layer of the integrated circuit layout, the first arrangement of metal lines being configured to electrically connect with contacts of a second layer of the integrated circuit layout after a manufacturing process; adjusting a metal line perimeter of at least one metal line in the center area of the integrated circuit layout to make a second arrangement of metal lines, wherein each adjusted metal line perimeter is separated from contacts in the second layer of the integrated circuit layout by at least a check distance; and depositing metal line material into a set of openings in a dielectric layer of the integrated circuit, the set of openings in the dielectric layer corresponding to the second arrangement of metal lines.

In some embodiments, the method further includes selecting a first portion of a perimeter of the at least one metal line in the center area; and moving the first portion of the metal line perimeter from an initial position to a second position closer to an adjoining metal line. In some embodiments, moving the first portion of the metal line perimeter includes connecting the at least one metal line to a second metal line. In some embodiments, moving the first portion of the metal line perimeter includes smoothing a perimeter of the at least one metal line. In some embodiments, the method includes measuring a separation distance between the second position of the metal line perimeter and a nearest metal line to the second position of the metal line perimeter; and further adjusting the metal line perimeter when the separation distance between the second position of the metal line perimeter and the nearest metal line to the second position of the metal line perimeter is less than the check distance, wherein a check window around an adjusted segment of the at least one metal line has a shape of the adjusted segment of the at least one metal line at the check distance from the adjusted segment of the metal line. In some embodiments, the method includes extending, for a discontinuous first portion of the metal line perimeter, at least one segment of the discontinuous first portion of the metal line perimeter to make a first extension intersecting with a second extension or the first portion of the metal line perimeter. In some embodiments, the method includes dividing the first area into a plurality of sub-areas, wherein at least one sub area has a top peripheral area and a bottom peripheral area; and reproducing, in each top peripheral area or each bottom peripheral area, a third arrangement of metal lines, wherein the third arrangement is a subset of the second set of metal lines. In some embodiments, adjusting a metal line perimeter of at least one metal line in the center area of the integrated circuit layout includes combining at least one metal line of the top peripheral area or the bottom peripheral area with a metal line of the center area of the integrated circuit.

Aspects of the present disclosure relate to an integrated circuit, including, for a first area of the integrated circuit: a set of contacts at a first layer of the integrated circuit; and a set of metal lines at a second layer of the integrated circuit, the second layer being over the first layer, wherein the first area has a center area and a peripheral area and the first area includes two terminal regions, such that, in each terminal region, the peripheral area surrounds the center area on three sides, the peripheral area in a first terminal region of the two terminal regions includes a first top peripheral area and a first bottom peripheral area on opposite sides of the center area, and a first edge peripheral area, the peripheral area in a second terminal region of the two terminal regions includes a second top peripheral area and a second bottom peripheral area on opposite sides of the center area, and a second edge peripheral area, the first and second top peripheral areas being on a same side of the center area, and metal lines of the first top peripheral area and the second top peripheral area each have a second pattern of metal lines. In some embodiments, metal lines of the first bottom peripheral area and the second bottom peripheral area each have a third pattern of metal lines. In some embodiments, the first area further comprises at least one non-terminal region between the first terminal region and the second terminal region, and wherein each non-terminal region has a non-terminal top peripheral area having the second pattern of metal lines. In some embodiments, wherein metal lines of the first bottom peripheral area, the second bottom peripheral area, and each non-terminal bottom area have a third pattern of metal lines. Aspects of the present disclosure relate to a method of making an integrated circuit, which includes assigning, to a first set of contacts of a first layer of a first area of the integrated circuit, a first pattern of metal lines of a second layer of the first area of the integrated circuit; assigning, to a second set of contacts of the first layer of the first area of the integrated circuit, a second pattern of metal lines of the second layer of the first area of the integrated circuit; determining, for each metal line in the second pattern of metal lines, whether to modify a metal line perimeter; assigning, to a first set of metal lines, metal lines of the second pattern determined to not undergo metal line perimeter adjustment; assigning, to a second set of metal lines, metal lines of the second pattern determined to undergo metal line perimeter adjustment; adjusting the metal line perimeter of each metal line in the second set of metal lines to have an adjusted metal line perimeter; generating a third pattern of metal lines based on the unadjusted metal lines of the first set of metal lines, and on the adjusted set of metal lines of the second set of metal lines, wherein the first pattern of metal lines is in a peripheral area of the first area and the second pattern of metal lines is in a center area of the first area; and forming, in a dielectric layer of the integrated circuit, metal lines having the third pattern of metal lines.

In some embodiments, the method further includes adjusting a first portion of a metal line perimeter for a metal line of the second area, wherein the second area is a center area of a layout of the integrated circuit, and wherein adjusting the first portion of the metal line perimeter further comprises moving an adjusted portion of the metal line perimeter to a second position at least a check distance away from a nearest metal line to the adjusted portion of the metal line perimeter.

In some embodiments, adjusting a first portion of the metal line perimeter further includes testing a second metal line perimeter segment by moving the first portion of the metal line perimeter closer to a contact of the first layer or a metal line of the second layer; determining whether the contact of the first layer of metal line of the second layer is within the check distance from each edge of the second metal line perimeter segment; and replacing the first portion of the metal line perimeter with the second metal line perimeter segment when the second metal line perimeter segment is beyond the check distance from a metal line of the second layer or a contact of the first layer. In some embodiments, adjusting a first portion of the metal line perimeter further comprises joining two metal lines in the center area. In some embodiments, the method further includes dividing the peripheral area of the first area, at a top side of the center area, into at least two top peripheral areas and repeating a third pattern of metal lines in each of the at least two top peripheral areas of the first area. In some embodiments, the method further includes dividing the peripheral area of the first area, at a bottom side of the center area, into at least two bottom peripheral areas and repeating a fourth pattern of metal lines in each of the at least two bottom peripheral areas of the first area. In some embodiments, the method further includes extending a VDD line through a top side of the peripheral area, and extending a VSS line through a bottom side of the peripheral area. In some embodiments, the method further includes holding an arrangement of metal lines in edge peripheral areas of the peripheral area unchanged during adjusting the metal line perimeter of the metal lines in the second set of metal lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making an integrated circuit, comprising:
dividing, in a first layer of an integrated circuit layout, a first arrangement of metal lines into a first set of metal lines and a second set of metal lines, wherein the first set of metal lines is located in a peripheral area of the integrated circuit layout and the second set of metal lines is located in a center area of the integrated circuit layout, wherein the first arrangement of the first set of metal lines and the second set of metal lines is located in the first layer of the integrated circuit layout, the first arrangement of metal lines being configured to electrically connect to a plurality of contacts connected to a second layer of the integrated circuit layout after a manufacturing process;
adjusting a metal line perimeter of at least one metal line in the center area of the integrated circuit layout to make a second arrangement of metal lines, wherein each adjusted metal line perimeter is separated from contacts in the second layer of the integrated circuit layout by at least a check distance; and
depositing metal line material into a set of contact opening in a dielectric layer of the integrated circuit, the set of contact openings in the dielectric layer corresponding to the second arrangement of metal lines.

2. The method of claim 1, further comprising
selecting a first portion of a perimeter of the at least one metal line in the center area; and
moving the first portion of the metal line perimeter from an initial position to a second position closer to an adjoining metal line.

3. The method of claim 2, wherein moving the first portion of the metal line perimeter comprises connecting the at least one metal line to a second metal line.

4. The method of claim 2, wherein moving the first portion of the metal line perimeter comprises smoothing a perimeter of the at least one metal line.

5. The method of claim 2, further comprising:
measuring a separation distance between the second position of the metal line perimeter and a nearest metal line to the second position of the metal line perimeter; and
further adjusting the metal line perimeter when the separation distance between the second position of the metal line perimeter and the nearest metal line to the second position of the metal line perimeter is less than the check distance, wherein a check window around an adjusted segment of the at least one metal line has a shape of the adjusted segment of the at least one metal line at the check distance from the adjusted segment of the metal line.

6. The method of claim 5, further comprising extending, for a discontinuous first portion of the metal line perimeter, at least one segment of the discontinuous first portion of the metal line perimeter to make a first extension intersecting with a second extension or the first portion of the metal line perimeter.

7. The method of claim 1, further comprising
dividing a first area into a plurality of sub-areas, wherein at least one sub area has a top peripheral area and a bottom peripheral area; and
reproducing, in each top peripheral area or each bottom peripheral area, a third arrangement of metal lines, wherein the third arrangement is a subset of the second set of metal lines.

8. The method of claim 7, wherein adjusting a metal line perimeter of at least one metal line in the center area of the integrated circuit layout further comprises combining at least one metal line of the top peripheral area or the bottom peripheral area with a metal line of the center area of the integrated circuit.

9. An integrated circuit, comprising, for a first area of the integrated circuit:

a set of contacts at a first layer of the integrated circuit; and a set of metal lines at a second layer of the integrated circuit, the second layer being over the first layer, wherein the first area has a center area and a peripheral area and the first area includes two terminal regions, wherein each terminal region comprises, the peripheral area surrounds the center area on three sides, the peripheral area in a first terminal region of the two terminal regions includes a first top peripheral area and a first bottom peripheral area on opposite sides of the center area, and a first edge peripheral area, the peripheral area in a second terminal region of the two terminal regions includes a second top peripheral area and a second bottom peripheral area on opposite sides of the center area, and a second edge peripheral area, the first and second top peripheral areas being on a same side of the center area, and metal lines of the first top peripheral area and the second top peripheral area each have a second pattern of metal lines.

10. The integrated circuit of claim 9, wherein metal lines of the first bottom peripheral area and the second bottom peripheral area each have a third pattern of metal lines.

11. The integrated circuit of claim 9, wherein the first area further comprises at least one non-terminal region between the first terminal region and the second terminal region, and wherein each non-terminal region has a non-terminal top peripheral area having the second pattern of metal lines.

12. The integrated circuit of claim 11, wherein metal lines of the first bottom peripheral area, the second bottom peripheral area, and each non-terminal bottom area have a third pattern of metal lines.

13. A method of making an integrated circuit, comprising:
assigning, to a first set of contacts of a first layer of a first area of the integrated circuit, a first pattern of metal lines of a second layer of the first area of the integrated circuit;
assigning, to a second set of contacts of the first layer of the first area of the integrated circuit, a second pattern of metal lines of the second layer of the first area of the integrated circuit;
determining, for each metal line in the second pattern of metal lines, whether to modify a metal line perimeter;
assigning, to a first set of metal lines, metal lines of the second pattern determined to not undergo metal line perimeter adjustment;
assigning, to a second set of metal lines, metal lines of the second pattern determined to undergo metal line perimeter adjustment;
adjusting the metal line perimeter of each metal line in the second set of metal lines to have an adjusted metal line perimeter;

generating a third pattern of metal lines based on the unadjusted metal lines of the first set of metal lines, and on the adjusted set of metal lines of the second set of metal lines, wherein the first pattern of metal lines is in a peripheral area of the first area and the second pattern of metal lines is in a center area of the first area; and forming, in a dielectric layer of the integrated circuit, metal lines having the third pattern of metal lines.

14. The method of claim 13, further comprising adjusting a first portion of a metal line perimeter for a metal line of the second area, wherein the second area is a center area of a layout of the integrated circuit, and wherein adjusting the first portion of the metal line perimeter further comprises moving an adjusted portion of the metal line perimeter to a second position at least a check distance away from a nearest metal line to the adjusted portion of the metal line perimeter.

15. The method of claim 14, wherein adjusting a first portion of the metal line perimeter further comprises
testing a second metal line perimeter segment by moving the first portion of the metal line perimeter closer to a contact of the first layer or a metal line of the second layer;
determining whether the contact of the first layer or the metal line of the second layer is within the check distance from each edge of the second metal line perimeter segment; and
replacing the first portion of the metal line perimeter with the second metal line perimeter segment when the second metal line perimeter segment is beyond the check distance from the metal line of the second layer or the contact of the first layer.

16. The method of claim 14, wherein adjusting a first portion of the metal line perimeter further comprises joining two metal lines in the center area.

17. The method of claim 13, further comprising dividing the peripheral area of the first area, at a top side of the center area, into at least two top peripheral areas and repeating a third pattern of metal lines in each of the at least two top peripheral areas of the first area.

18. The method of claim 17, further comprising dividing the peripheral area of the first area, at a bottom side of the center area, into at least two bottom peripheral areas and repeating a fourth pattern of metal lines in each of the at least two bottom peripheral areas of the first area.

19. The method of claim 13, further comprising extending a VDD line through a top side of the peripheral area, and extending a VSS line through a bottom side of the peripheral area.

20. The method of claim 13, further comprising holding an arrangement of metal lines in edge peripheral areas of the peripheral area unchanged during adjusting the metal line perimeter of the metal lines in the second set of metal lines.

* * * * *